United States Patent [19]

Ting et al.

[11] Patent Number: 5,737,271
[45] Date of Patent: Apr. 7, 1998

[54] SEMICONDUCTOR MEMORY ARRAYS

[75] Inventors: Tah-Kang Joseph Ting, Hsinchu; Bor-Doou Rong, Chupei; Yung-Ching Hsieh, Hsinchu, all of Taiwan

[73] Assignee: Etron Technology, Inc., Hsin-Chu, Taiwan

[21] Appl. No.: 808,205

[22] Filed: Feb. 28, 1997

[51] Int. Cl.$^6$ ........................................ G11C 7/00
[52] U.S. Cl. ............................... 365/203; 365/233
[58] Field of Search ........................... 365/203, 233, 365/189.05, 189.11, 191

[56] References Cited

U.S. PATENT DOCUMENTS

| | | | |
|---|---|---|---|
| 4,998,222 | 3/1991 | Sussman | 365/203 |
| 5,185,719 | 2/1993 | Dhong et al. | 365/189.01 |
| 5,315,551 | 5/1994 | Hirayama | 365/203 |
| 5,357,468 | 10/1994 | Satani et al. | 365/203 |
| 5,522,064 | 5/1996 | Alderegula et al. | 395/550 |
| 5,563,831 | 10/1996 | Ting | 365/189.09 |

*Primary Examiner*—Vu A. Le
*Attorney, Agent, or Firm*—George O. Saile; Stephen B. Ackerman

[57] ABSTRACT

Circuits and methods are disclosed for a row activation control logic for memory arrays. This invention utilizes a row activation control circuit and a NOR gate, in conjunction with a previously disclosed timing reference circuit, to allow the shortening of the row precharge time, yet insuring that the bitline is getting charged well enough without causing the chip to read wrong data at the next row activation. The circuits and methods disclosed can be applied to different types of dynamic random access memories.

12 Claims, 6 Drawing Sheets

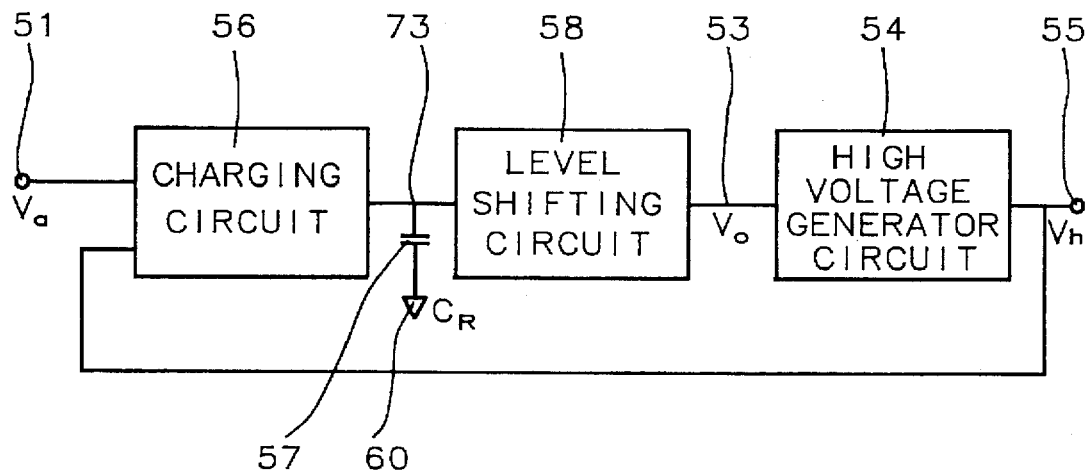
FIG. 3 - Prior Art
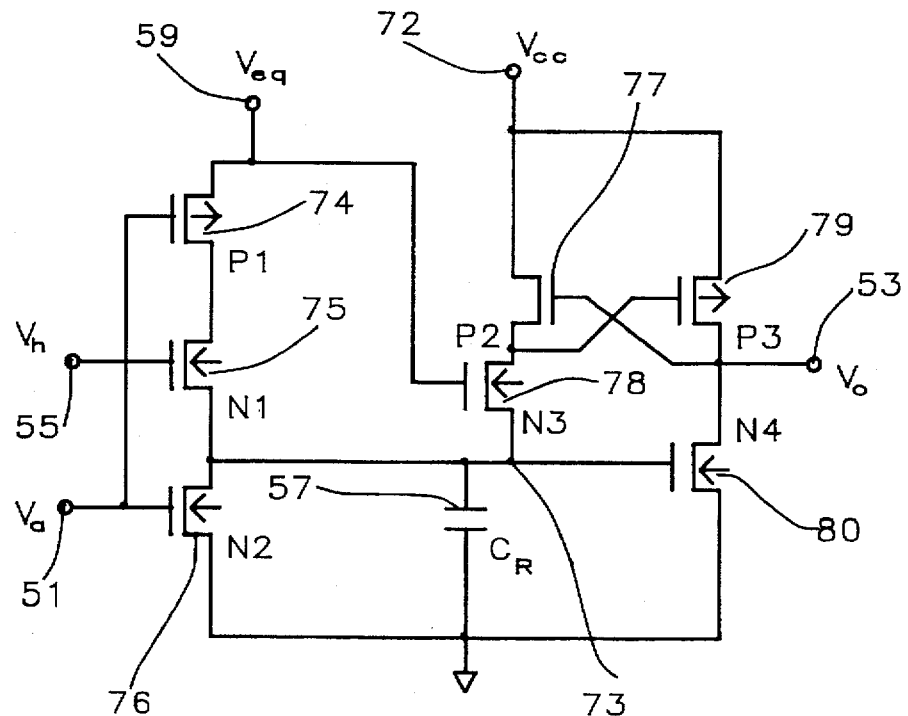
FIG. 4 - Prior Art 5,737,271

SEMICONDUCTOR MEMORY ARRAYS

RELATED PATENT APPLICATION

ETRON96-005, $t_{RAS}$ PROTECTION CIRCUIT title filing date Jun. 10, 1996, Ser. No. 08/661,228, assigned to a common assignee.

BACKGROUND OF THE INVENTION

1. Field of the Invention

The invention relates to timing circuits for semiconductor memory arrays, in particular to row activation and precharge command timing circuits as used in dynamic random access memory (DRAM) arrays.

2. Description of the Prior Art

The memory cycle of semiconductor memory arrays is divided into a ROW ACTIVATION (active period) and ROW PRECHARGE period (inactive period). During row activation the memory cells are accessed and during row precharge the bitlines and inverse bitlines, which were at a high or low voltage depending on the state of the cell, must be precharged to an initial voltage to be ready for the next active period. Included in the row precharge time is a safety margin, mainly to insure that precharging is completed. If not completed, it will cause the chip to get the wrong data at the next row activation. Efforts have been made to reduce the row precharge time while at the same time guaranteeing the completion of precharge.

A number of U.S. Patents deal with precharge timing in memory arrays. U.S. Pat. No. 4,998,222 (Sussman) discloses the use of an internally gated RAS signal to allow for the elimination of the need to skew the beginning of Precharge due to process variation. U.S. Pat. No. 5,185,719 (Dong et al.) discloses extending RAS reset/precharge using an on-chip generated control signal. U.S. Pat. No. 5,522,064 (Aldereguia et al.) describes a memory controller having timing registers to allow for the dynamic setting of memory timings for a plurality of memory chips that differ in size and speed. U.S. Pat. No. 5,563,831 (Ting) reveals a timing reference circuit which maintains a higher voltage at the gates of the isolation MOSFET's in the memory array during the precharge period and returning the voltage to a lower level before the end of the inactive period. This patent is assigned to the same assignee as the current invention.

SUMMARY OF THE INVENTION

It is an object of the present invention to provide circuits and methods to allow row activation in a semiconductor memory array during row precharge and without interrupting row precharge.

Another object of the present invention is to allow flexibility in timing of the row activation command after the precharge command.

A further object is to make the present invention applicable to different types of random access memories.

These objects have been achieved by combining a previously disclosed timing reference circuit with a row activation control circuit and a NOR gate. The addition of the row activation control circuit and the NOR gate insures that the bitline is getting precharged fully when the row precharge time is shortened to insure that the chip is reading out the correct data at the next row activation.

BRIEF DESCRIPTION OF THE DRAWINGS

FIG. 3 is a block diagram showing the timing reference circuit and high voltage generator circuit of the prior art.

FIG. 4 is a schematic diagram of the timing reference circuit of the prior art.

DESCRIPTION OF THE PREFERRED EMBODIMENT

Memory arrays, such as dynamic random access memory or DRAM arrays, are divided into an active, or row activation, period and an inactive, or row precharge, period. Information is either read from the memory cell or stored in the memory cell during the active period. During the inactive period bitlines and inverse bitlines must be precharged to an initial voltage level in preparation for the next memory cycle (the active period).

Figure 1:
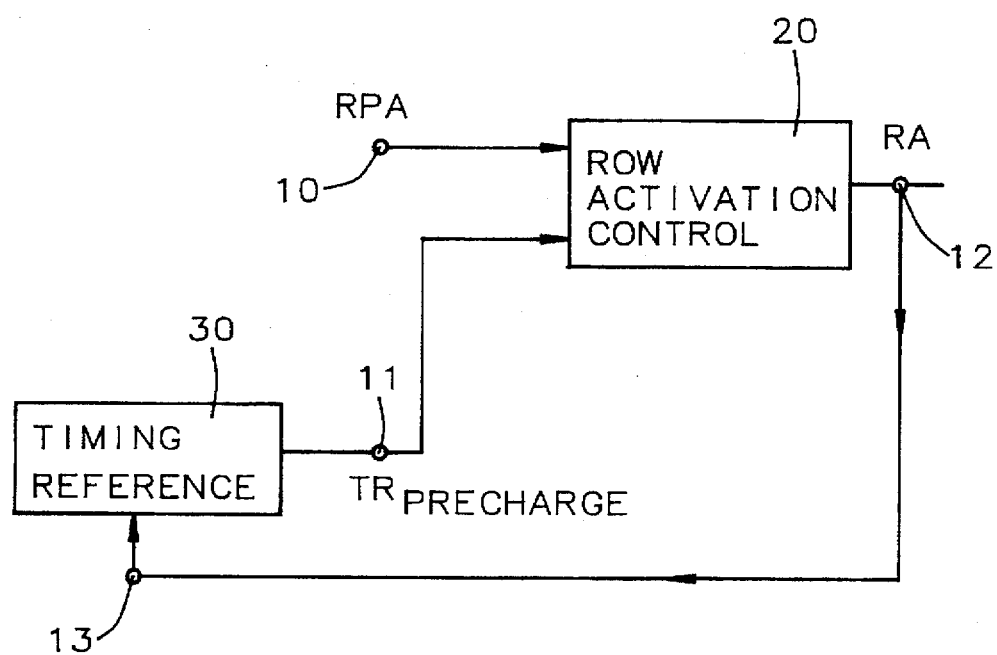
FIG. 1 is a high level block diagram of the present invention.

Referring now to FIG. 1 we show the embodiment of the present invention. FIG. 1 is a high level block diagram of the row activation control logic, consisting of row activation control circuit 20 and timing reference 30. Row activation control circuit 20 has a first input, Registered Row Activation (RRA) 10, a second input, $TR_{precharge}$ 11, and an output, Row Activation (RA) 12. Output 12 (RA) provides a logical one voltage level and a logical zero voltage level. Input 10 (RRA) provides a logical one voltage level during the active period of a memory cycle and a logical zero voltage level during the inactive period of the memory cycle. Input 11, $TR_{precharge}$, also provides a logical one and zero voltage level. Output 12 is input 13 to timing reference 30.

Figure 2:
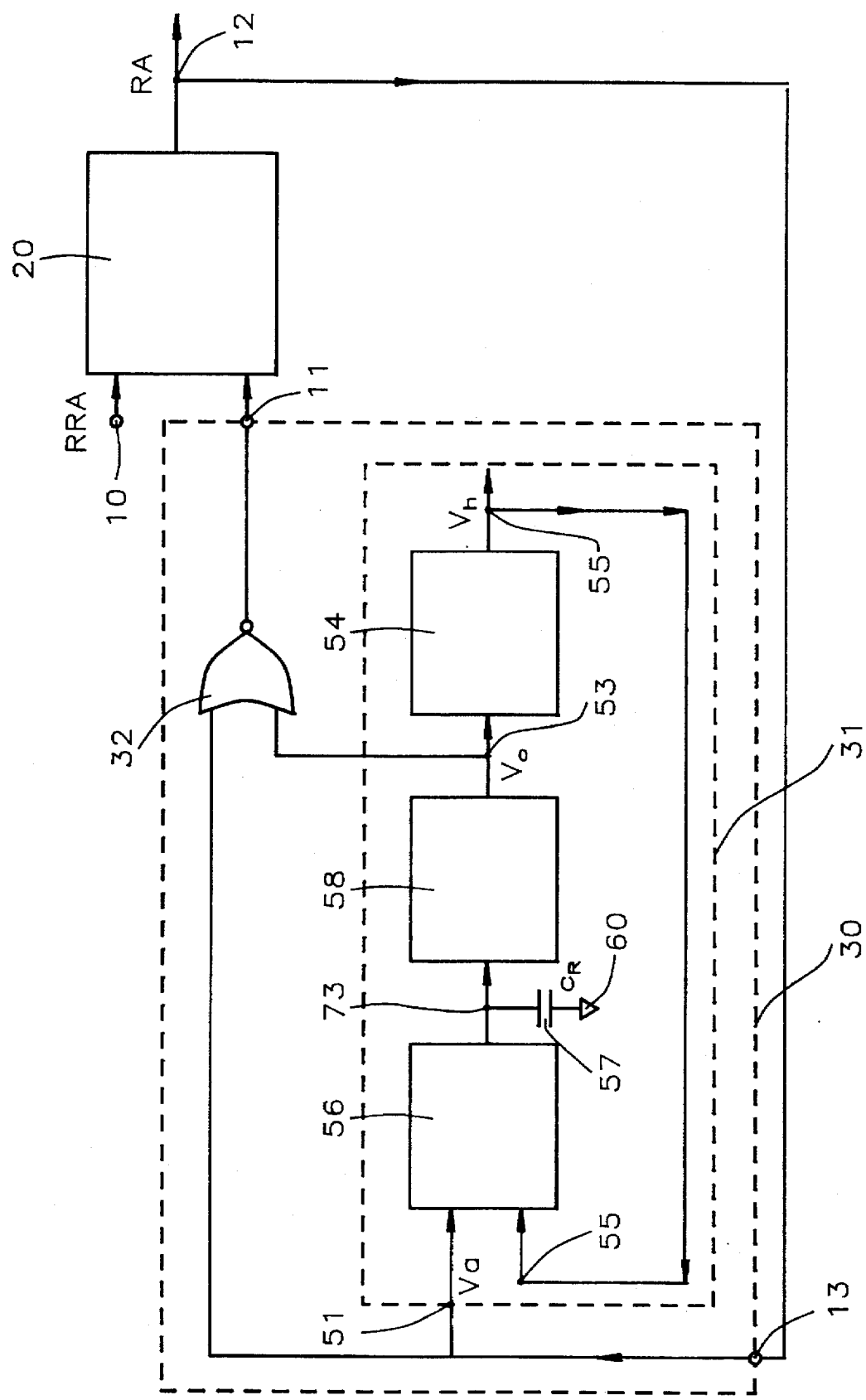
FIG. 2 is a circuit diagram of the present invention.

Referring now to FIG. 2, a detailed block diagram of the row activation control logic is shown. Timing reference 30 consists of timing reference circuit 31 and NOR gate 32. The function and purpose of timing reference circuit 31 (consisting of Charging Circuit 56, Reference Capacitor 57, Level Shifting Circuit 58, and High Voltage Generator Circuit 54) is described in detail in U.S. Pat. No. 5,563,831 (Ting) "TIMING REFERENCE CIRCUIT FOR BITLINE PRECHARGE IN MEMORY ARRAYS" and is incorporated herein by reference. FIG. 4, block diagram, and FIG. 6, schematic diagram, of the referenced patent are shown here again as FIG. 3 and FIG. 4 respectively.

Part of timing reference 30 is NOR gate 32, with a first input connected to input 13 of timing reference 30. The second input is connected to output 53 ($V_o$) of the referenced Level Shifting Circuit 58. The output of NOR gate 32 is connected to input 11 ($TR_{precharge}$) of row activation control circuit 20. The second input 51, $V_a$, of Charging Circuit 56 is connected to input 13 of timing reference 30.

Figure 5:
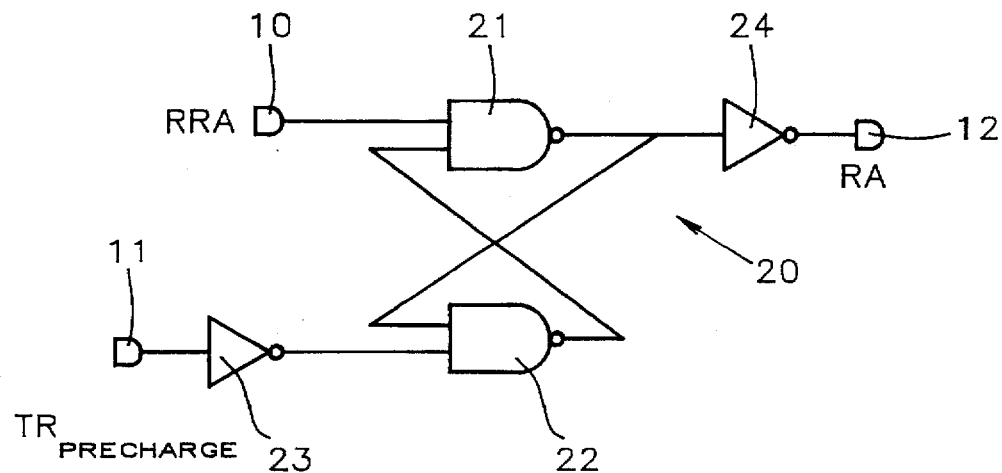
FIG. 5 is a circuit diagram of the row activation control circuit of the present invention.

Referring now to FIG. 5, we show a circuit diagram of row activation control circuit 20. The first input of first NAND gate 21 is connected to input 10 (RRA) of row activation control circuit 20, the second input is connected to the output of the second NAND gate 22. The output of the first NAND gate 21 is connected to the input of the second inverter 24. The first input of the second NAND gate 22 is connected to the output of the first NAND gate 21. The second input of the second NAND gate 22 is connected to the output of the first inverter 23. The input of the first inverter 23 is connected to the second input 11 ($TR_{precharge}$) of row activation control circuit 20. The output of second inverter 24 is connected to output 12 (RA) of row activation control circuit 20.

Figure 6:
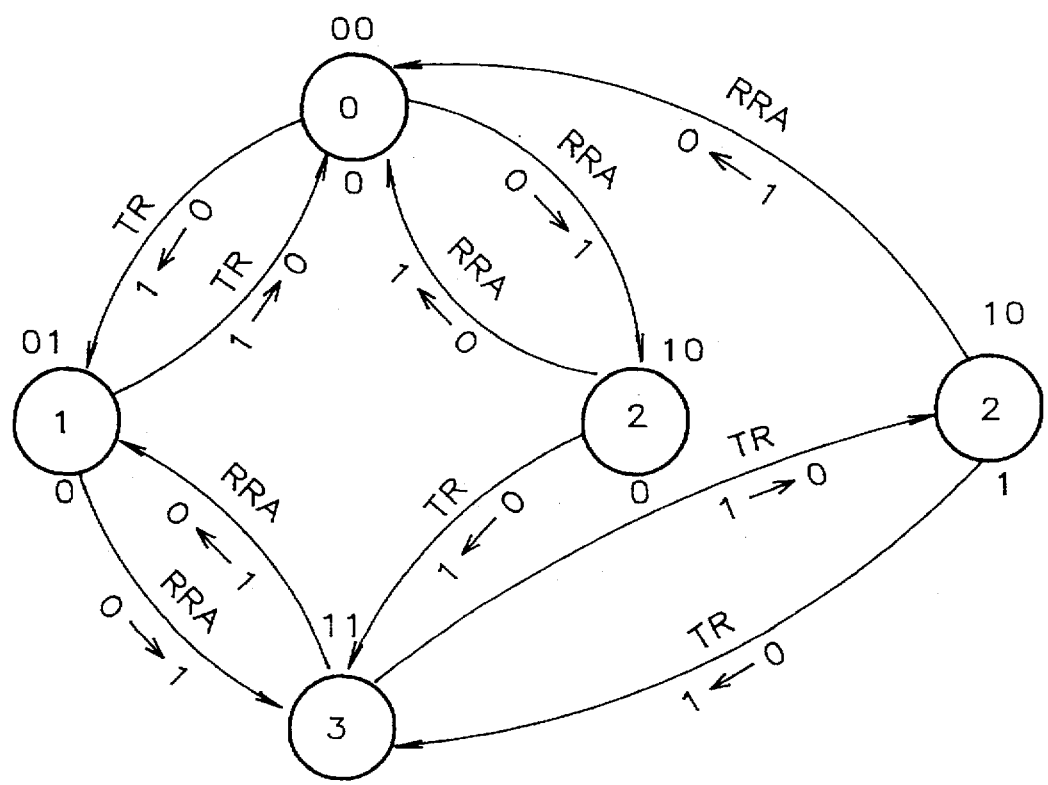
FIG. 6 is a state diagram of FIG. 3, relating inputs to output.

The state diagram for row activation control circuit 20 is depicted in FIG. 6. The number within the circle designates the "state" of the row activation control circuit; the first number above the circle indicates the logic level of first input RRA, and the second number indicates the logic level of second input $TR_{precharge}$. The bottom number is the logic level of output RA. There is a state 2 where the output RA=0, designated as 2-0, and there is a state 2 where the output RA=1, designated as 2-1. It is noted that 2-0 cannot be reached directly from state 3, and conversely 2-1 cannot be reached directly from state 0. This characteristic is important for the functioning of the row activation control logic and is demonstrated in FIG. 7a and 7b.

Figure 7A:
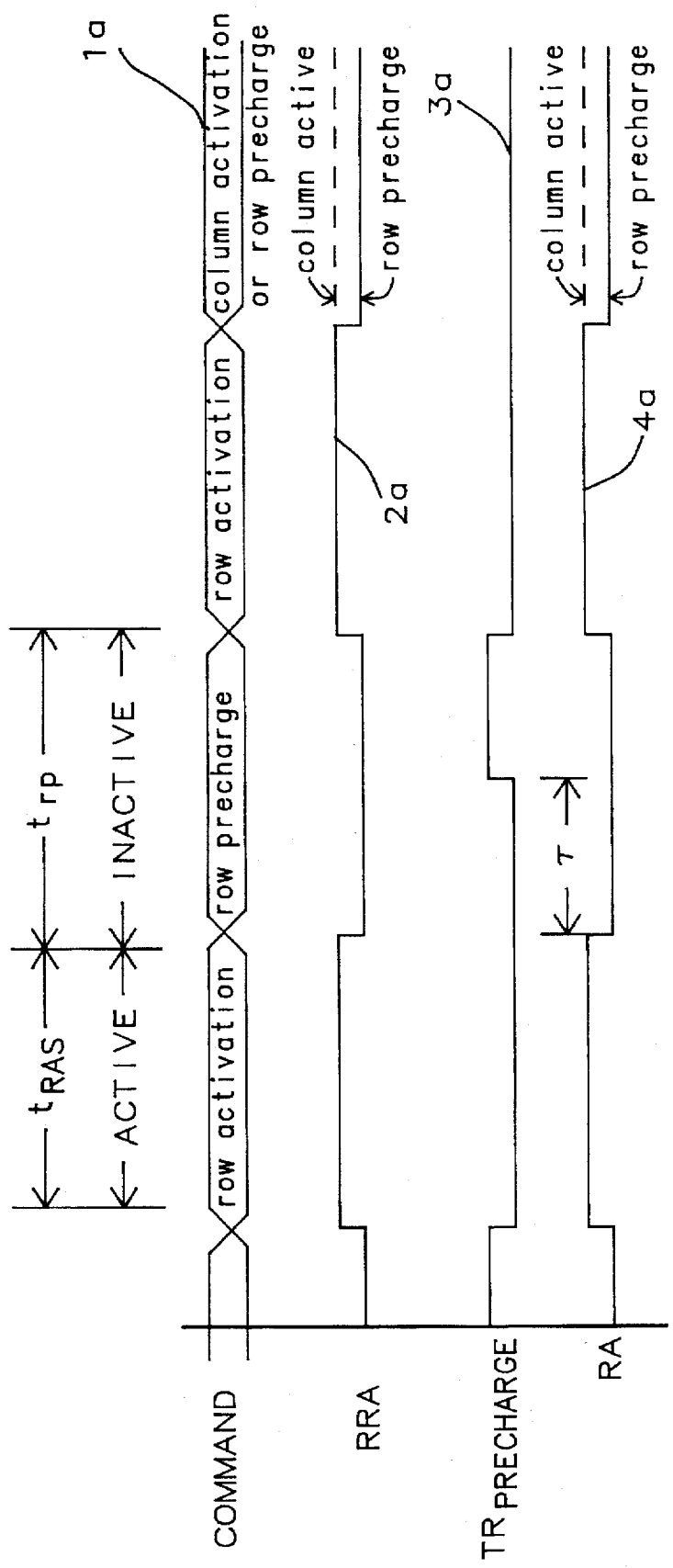
FIG. 7a is a view of the input and output signals of the high level block diagram as shown in FIG. 1, when τ is smaller than row precharge.

Curves 1a, 2a, 3a, and 4a of FIG. 7a demonstrate the condition where the command ROW PRECHARGE, Curve 1a, is longer than the bitline precharge time τ. RRA equal to logical voltage 1 corresponds to the active part of the cycle and RRA equal to logical 0 corresponds to the inactive part of the cycle, Curve 2a. RA, Curve 4a, is being held at logical voltage 1 because during most of RRA active, state 2-1 is forcing RA to a "1". When RRA drops, so does RA and the charging of capacitor 57 starts. When charged, after time τ, $TR_{precharge}$ becomes active, Curve 3a, because both RA and output 53, FIG. 2, are at logical "0".

Figure 7B:
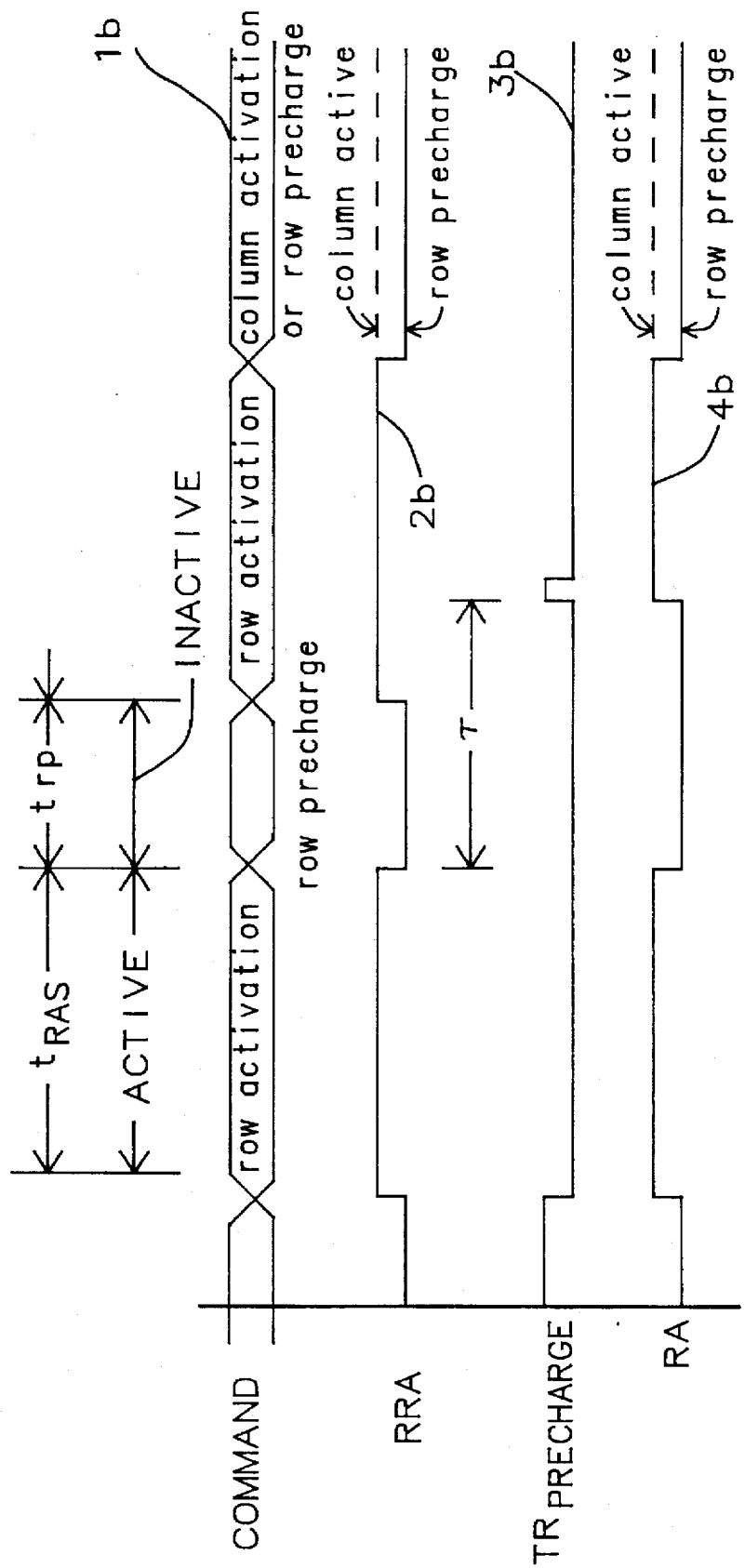
FIG. 7b is a view of the input and output signals of the high level block diagram as shown in FIG. 1, when τ is larger than row precharge.

Curves 1b, 2b, 3b, and 4b of FIG. 7b demonstrate the condition where the command ROW PRECHARGE, Curve 1b, is shorter than the bitline precharge time τ. This corresponds to RRA being at logical 0 for a shorter time, Curve 2b. For the same reasons as explained above, RA (Curve 4b) is being held at logical voltage 1. When RRA drops, so does RA and the logic circuit enters state 0. When RRA becomes active during the charging of capacitor 57, state 2-0 is entered, and RA stays at "0". On the completion of charging, output 53 ($V_o$) goes to logical zero voltage level. In conjunction with RA=0, $TR_{precharge}$ goes to logical "1" (Curve 3b). RA then switches to "1" (Curve 4b) and in turn resets $TR_{precharge}$ (Curve 3b).

What this invention accomplishes is that RRA can go to logical "1", while capacitor 57 is charging, without causing this capacitor to be discharged prematurely. Since the duration of the inactive period (RRA at logical "0") does not affect row precharge (capacitor charging), the row activation command can be issued (i.e. RRA=1) before row precharge is finished. This feature allows flexibility in timing of the row activation command after the precharge command.

The condition under which the chip can go into row activation is not only when receiving the row activation command, but also when the internal bitline precharge is completed, as controlled by the timing reference 30. Therefore the transition point between row precharge ($t_{rp}$) and row activation ($t_{rcd}$ or $t_{RAS}$) is controlled by the timing reference, where τ is the optimum bitline precharge time. The invention allows the row activation command to be issued as early as possible i.e. at the optimal time.

Since timing reference 30 tracks the bitline precharge time, when $TR_{precharge}$ goes to "1" the real bitline signals are precharged completely and the row activation is allowed to execute. Tracking is assured because both the bitline and the reference capacitor 57 have matched capacitances and are fabricated by the same process. Process variations, therefore, affect both capacitances the same way.

The circuits and method described apply to any of the dynamic random access memories such as, but not limited to, synchronous dynamic random access memory arrays, synchronous graphics random access memory arrays, extended data out dynamic random access memory arrays, and fast page mode dynamic random access memory arrays.

While the invention has been particularly shown and described with reference to the preferred embodiments thereof, it will be understood by those skilled in the art that various changes in form and details may be made without departing from the spirit and scope of the invention.

What is claimed is:

1. A method of allowing flexible row activation and row precharge timing in a memory, comprising:

receiving a row precharge command to begin charging of bit lines in said memory;

generating a precharge complete signal upon completion of precharging of said bit lines, wherein said precharging requires a time τ;

receiving and registering a row activation command, where said row activation command may be received prior to completion of said bitline precharging; and using said precharge complete signal and the registered row activation command to initiate an active period in said memory.

2. A row activation control logic for semiconductor memory arrays, comprising:

a row activation control circuit having a first input, a second input, and an output, said output of said row activation control circuit providing a logical one voltage level and a logical zero voltage level;

a row command register providing a logical one voltage level during an active period of a memory cycle and a logical zero voltage level during an inactive period of said memory cycle connected to said first input of said row activation control circuit, and a timing reference with an input and an output, said input of said timing reference connected to said output of said row activation control circuit, said output of said timing reference connected to said second input of said row activation control circuit.

3. The circuit of claim 2, wherein said row activation control circuit comprises:

a first NAND gate with a first input, a second input and an output, said first input of said first NAND gate connected to said first input of said row activation control circuit;

a second NAND gate with a first input, a second input and an output, said first input of said second NAND gate connected to said output of said first NAND gate, said output of said second NAND gate connected to said second input of said first NAND gate;

a first inverter with an input and an output, said input of said first inverter connected to said second input of said row activation control circuit, said output of said first inverter connected to said second input of said second NAND gate, and a second inverter with an input and an output, said input of said second inverter connected to said output of said first NAND gate, said output of said second inverter connected to said output of said row activation control circuit.

4. The circuit of claim 2, wherein said timing reference comprises:

a NOR gate having a first input, a second input, and an output, said first input of said NOR gate connected to said input of said timing reference, said output of said NOR gate connected to said output of said timing reference, and a timing reference circuit with an input and an output, said input of said timing reference circuit connected to said input of said timing reference, and said output of said timing reference circuit connected to said second input of said NOR gate, said timing reference circuit charging a reference capacitor to a reference voltage.

5. The circuit of claim 2, wherein said active period may start without interrupting charging of said reference capacitor to said reference voltage.

6. The circuit of claim 2, wherein said active period may start while said reference capacitor is being charged without interrupting charging of said reference capacitor to said reference voltage.

7. The circuit of claim 2, wherein the length of said inactive period may vary in duration without interrupting charging of said reference capacitor to said reference voltage.

8. A method of memory array row activation and precharge command timing, comprising:

providing a row activation control circuit having a first input, a second input, and an output, said output of said row activation control circuit providing a logical one voltage level and a logical zero voltage level;

providing a row command register supplying a logical one voltage level during an active period of a memory cycle and a logical zero voltage level during an inactive period of said memory cycle connected to said first input of said row activation control circuit, and providing a timing reference with an input and an output, said input of said timing reference connected to said output of said row activation control circuit, said output of said timing reference connected to said second input of said row activation control circuit, said timing reference circuit charging a reference capacitor to a reference voltage.

9. The method of claim 8, wherein said active period may start without interrupting charging of said reference capacitor to said reference voltage.

10. The method of claim 8, wherein said active period may start while said reference capacitor is being charged without interrupting charging of said reference capacitor to said reference voltage.

11. The method of claim 8, wherein the length of said inactive period may vary in duration without interrupting charging of said reference capacitor to said reference voltage.

12. The method of claim 8, wherein said memory array is a dynamic random access memory array.

* * * * *